United States Patent [19]

Tsang

[11] Patent Number: 4,612,258

[45] Date of Patent: Sep. 16, 1986

[54] METHOD FOR THERMALLY OXIDIZING POLYCIDE SUBSTRATES IN A DRY OXYGEN ENVIRONMENT AND SEMICONDUCTOR CIRCUIT STRUCTURES PRODUCED THEREBY

[75] Inventor: Juine-Kai Tsang, Sunnyvale, Calif.

[73] Assignee: Zilog, Inc., Campbell, Calif.

[21] Appl. No.: 684,911

[22] Filed: Dec. 21, 1984

[51] Int. Cl.[4] .................... H01L 29/12; B05D 5/12
[52] U.S. Cl. ..................... 428/620; 427/58; 427/93; 427/96; 427/99; 427/248.1; 427/255; 427/255.3; 428/333; 428/686
[58] Field of Search ............... 428/620, 333, 686; 427/93, 96, 58, 99, 295, 255, 248.1, 255.3; 29/571

[56] References Cited

U.S. PATENT DOCUMENTS

| | | | |
|---|---|---|---|
| 4,180,596 | 12/1979 | Crowder et al. | 427/42 |
| 4,276,557 | 6/1981 | Levinstein et al. | 357/67 |
| 4,324,038 | 4/1982 | Chang et al. | 29/571 |
| 4,332,839 | 6/1982 | Levinstein et al. | 427/85 |
| 4,337,476 | 6/1982 | Fraser et al. | 357/67 |
| 4,389,257 | 6/1983 | Geipel, Jr. et al. | 148/1.5 |
| 4,419,810 | 12/1983 | Riseman | 29/571 |
| 4,450,620 | 5/1984 | Fuls et al. | 29/571 |
| 4,468,308 | 8/1984 | Scovell et al. | 204/192 R |
| 4,470,189 | 9/1984 | Roberts et al. | 427/93 X |

OTHER PUBLICATIONS

Mohammadi et al., "Kinetics of the Thermal Oxidation of $WSi_2$", *Appl. Phys. Lett.* 35(7), Oct. 1, 1979, pp. 529–531.

Crowder et al., "1 $\mu$m MOSFET VLSI Technology: Part VII, *IEEE Journal of Solid-State Circuits*, vol. SC-14, No. 2, 04/1979, pp. 291–293.

Murarka et al., "Refractory Silicides", *IEEE Transactions of Electron Devices*, vol. ED-27, No. 8, Aug. 1980, pp. 1409–1417.

*Primary Examiner*—Thurman K. Page
*Attorney, Agent, or Firm*—Majestic, Gallagher, Parsons & Siebert

[57] ABSTRACT

A method of thermally oxidizing polycide substrates in a dry oxygen environment as well as a MOSFET structure provided by the method are disclosed. The method includes heating a plurality of polycide substrates to temperatures greater than about 800 degrees Centigrade in a dry oxygen environment, and introducing into the environment an amount of a halogenated alkane gas sufficient to induce oxidation.

17 Claims, 4 Drawing Figures

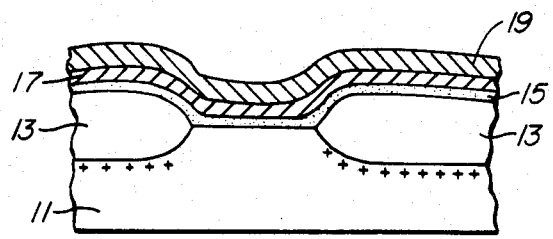
FIG._1.
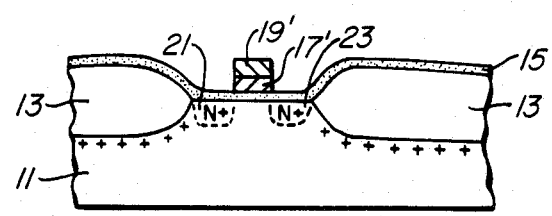
FIG._2.
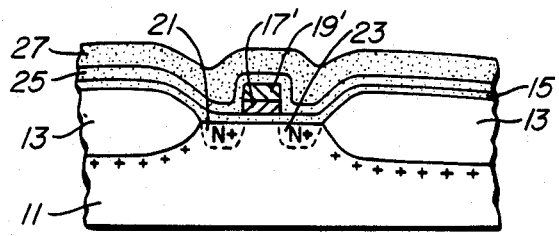
FIG._3.
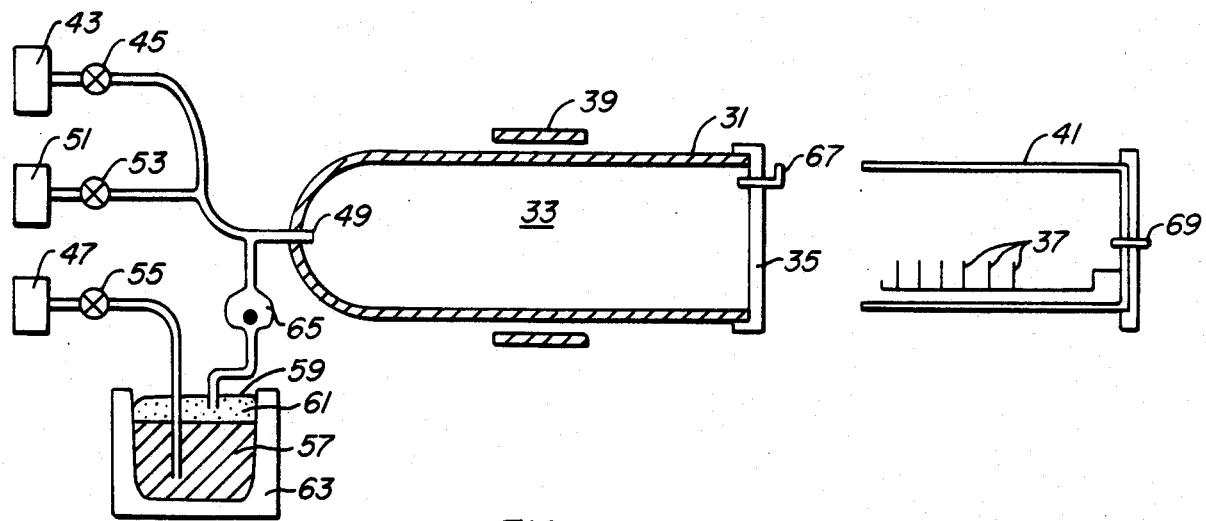
FIG._4.

METHOD FOR THERMALLY OXIDIZING POLYCIDE SUBSTRATES IN A DRY OXYGEN ENVIRONMENT AND SEMICONDUCTOR CIRCUIT STRUCTURES PRODUCED THEREBY

FIELD OF THE INVENTION

The present invention relates generally to the field of integrated circuit fabrication, and more particularly concerns a method for thermally oxidizing polycide substrates in a dry oxygen environment.

BACKGROUND OF THE INVENTION

The design and manufacture of semiconductor integrated circuits is well known in the art. With the many recent advances in integrated circuit technology, device dimensions are continuously decreasing while the packing density and complexity of these devices are correspondingly increasing. Coincident with these advances are also increasingly stringent requirements for electrical interconnection materials. Briefly, these requirements are low resistivity, the ability to withstand the chemicals and high temperatures used in fabrication processes, and the capability of being patterned into fine lines.

In a typical MOSFET structure, for example, an epitaxially grown single-crystal silicon layer provides a base or substrate, while polycrystalline silicon ("polysilicon") is the standard material for both gate and interconnect structures. The polysilicon is insulated from electrically conductive overlayers and the single crystal silicon substrate by layers of silicon dioxide. Although polysilicon provides the requisite stability to processing chemicals and high temperatures, a major limitation now restricting its utility as an interconnection material in high performance devices is its limited conductivity. Even heavily doped polysilicon has a conductivity of only about 300 micro-ohm·cm., thus imposing a serious limitation on circuit performance. One proposed solution has been to replace polysilicon with pure metals such as aluminum, tungsten or titanium, which have a conductivity far higher than that of polysilicon. However, these materials are also limited in that they may react with the silicon substrate at the high temperatures used in integrated circuit fabrication and may additionally be unable to withstand the chemical reagents used in processing.

An alternative solution has been the incorporation of refractory metal silicides into integrated circuit fabrication technology. Silicides offer several advantages over single-layer doped polysilicon. In contrast to doped polysilicon, which at a typical thickness of 4500 Angstroms has a sheet resistivity of 15 ohms per sheet or more, silicides provide on the order of 2 ohms per sheet or less. Tantalum and tungsten silicides each have sheet resistivities of about 2 ohms per sheet, molybdenum silicide about 1.5 to about 2.0 ohms per sheet, and titanium silicide about 0.5 ohms per sheet. Silicides are also compatible with MOSFET and other integrated circuit fabrication processes as they can generally withstand high temperatures and caustic processing chemicals. Finally, providing there is sufficient silicon underlying the silicide layer, a self-passivating silicon dioxide layer can be thermally grown over the silicide without any degradation of chemical or electrical properties of the silicide film.

Metallic silicides provide the desired resistivity and the chemical and thermal stability necessary for use as interconnects, and they function well as FET gates. A layered structure having a polysilicon layer sufficiently thick to serve as a transistor gate, underlying the silicide, is often used. These "polycide" structures have resistivities on the order of 4 ohms per sheet or less where the combined thickness of both layers is about 4500 Angstroms. The use of such polycide structures is fairly recent but is known in the art. U.S. Pat. No. 4,180,596 to Crowder et al., for example, discloses a method of providing a silicide layer on a polysilicon substrate by means of sputtering and a subsequent annealing process. U.S. Pat. No. 4,468,308 to Scovell et al. shows a method of providing a silicide layer on a semiconductor substrate using a vapor deposition technique. Other semiconductor circuit structures having a silicide layer include those disclosed in the following: U.S. Pat. No. 4,276,557 to Levinstein et al., which shows a tantalum or titanium silicide layer sandwiched between a layer of doped polysilicon and a vapor-deposited layer of silicon dioxide; U.S. Pat. Nos. 4,332,839 to Levinstein et al. and 4,337,476 to Fraser et al., which show a silicide layer interposed between a layer of polysilicon and a thermally grown layer of silicon dioxide; and U.S. Pat. No. 4,450,620 to Fuls et al., which shows an MOS integrated circuit device having both silicide and polysilicon layers.

After deposition of a silicide layer on polysilicon to form a polycide structure, an insulating silicon dioxide layer is normally provided thereon, by oxidation of the silicide or low pressure chemical vapor deposition (LPCVD) or both. A problem encountered in the thermal oxidation of metallic silicides and noted in the prior art is the poor oxidation of silicides in dry oxygen (see, e.g., U.S. Pat. No. 4,332,839 to Levinstein et al., and Murarka, et al., "Refractory Silicides of Titanium and Tantalum for Low-Resistivity Gates and Interconnects," IEEE Transactions on Electronic Devices, ED-27(8), pp. 1409–1417 (1980)). This problem has been particularly noted with respect to tantalum disilicide, which is almost completely resistant to a dry oxygen environment; no silicon dioxide can be grown even at temperatures of up to 1000 degrees Centigrade. The problem has also been noted with regard to tungsten disilicide; although evaporated tungsten disilicide may be oxidized in either a pure $O_2$ or an $H_2O$ environment, tungsten disilicide deposited by sputtering behaves as tantalum disilicide in an $O_2$-only ambient and will not oxidize.

While several references have suggested the alternative of steam oxidation (notably Murarka et al., and Crowder, et al., 1 $\mu$M MOSFET VLSI Technology: Part VII—Metal Silicide Interconnection Technology—A Future Perspective," IEEE Journal of Solid-State Circuits, SC-14 (2), pp. 291–293 (1979)), the prior art does not suggest a feasible method of dry oxidation. In an integrated circuit manufacturing process, steam oxidation is often undesirable. Oxide growth rate in a steam oxidation process can be uncontrollably high, and growth rates may be very different on single-crystal silicon, on polysilicon and on polycide. Oxidation in a dry environment is not only more uniform, but is slower and therefore easier to control.

SUMMARY OF THE INVENTION

Accordingly, it is an object of the present invention to provide a method of thermally oxidizing polycide substrates in controlled and uniform manner.

It is another object of the invention to provide a method of thermally oxidizing polycide substrates in a dry oxygen environment.

It is still another object of the invention to provide a method of thermally growing a silicon dioxide layer on a polycide substrate in a dry oxygen environment, using a relatively small amount of a halogenated alkane gas such as trichloroethane and temperatures greater than about 800 degrees Centigrade.

It is a further object of the invention to provide a semiconductor integrated circuit structure including a silicide layer and a layer of silicon dioxide thermally grown in a dry oxygen ambient thereon.

Additional objects, advantages and novel features of the invention will be set forth in part in the description which follows, and in part will become apparent to those skilled in the art on examination of the following.

To achieve the foregoing and other objects, and in accordance with the purpose of the present invention, the method includes heating to a temperature greater than about 800 degrees Centigrade a polycide substrate in a dry oxygen environment, and introducing into the environment an amount of a halogenated alkane gas sufficient to induce oxidation.

In a further aspect of the present invention, the halogenated alkane gas is a chlorinated alkane, and a particularly preferable compound is 1,1,1-trichloroethane. The polycide substrate is emplaced in a substantially enclosed chamber including a gas inlet means and a gas outlet means, whereby the chamber may be filled with gas and maintained at atmospheric pressure. The chamber is filled with dry oxygen, heated to a temperature preferably between about 900 and 950 degrees Centigrade, and an amount of 1,1,1,-trichloroethane between about 1% and 10% by volume of the total volume of the gas flowing through the chamber is introduced. The substrate is heated for a length of time sufficient to provide a desired thickness of silicon dioxide thereon.

BRIEF DESCRIPTION OF THE DRAWINGS

FIG. 1 is a cross-sectional representation of a semiconductor element partially formed;

FIG. 2 shows the same element of FIG. 1 after further processing;

FIG. 3 shows the semiconductor element of FIGS. 1 and 2 after yet further processing steps have been performed; and FIG. 4 is a schematic representation of a piece of semiconductor wafer processing equipment.

DETAILED DESCRIPTION OF THE INVENTION

Referring to FIGS. 1 and 2, a known technique for forming polycide conductors is described. The example given is the formation of a metal-oxide-silicon (MOS) field effect transistor (FET). A silicon semiconductor substrate 11 initially has thick field oxide (FOX) thermally grown in all areas other than where active devices are to be formed. This field oxide is usually grown after those same areas are doped to isolate the active devices from one another. The ionization may be done by implanting boron ions in such regions. The top surface of the wafer 11 is initially flat but growth of the field oxide layers 13 consumes a layer of silicon at the top surface, thus forming the depressed regions shown in FIG. 1.

The next step in standard integrated circuit formation techniques is to grow a thin layer 15 of very high quality silicon dioxide over the wafer surface. This oxide layer will serve as the gate oxide of the active devices.

Next, a layer 17 of polysilicon is formed by standard techniques over the entire surface of the wafer. Next, a layer 19 of a refractory metal silicide is formed in a known manner, preferably by sputtering. The silicide layer 19 may be any one of a number of specific compounds satisfying the formula $MSi_x$, where x ranges from about 2.2 to about 2.6, and M is a metal selected from the group consisting of tantalum, tungsten, titanium, molybdenum and mixtures thereof.

After the silicide layer 19 is deposited, that layer and the polysilicon 17 are removed from all areas of the wafer where conductors are not to be permanently formed. The layers 17 and 19 are removed in unwanted areas by the use of standard photoresist masking and etching techniques. As shown in FIG. 2, this leaves a polycide gate structure formed of the layer 17' of polysilicon and layer 19' of selected metal silicide. The total thickness is preferably approximately 4500 Angstroms with the polysilicon layer 17' being approximately 2000 Angstroms of that total thickness. This provides enough polysilicon for the necessary gate function and enough silicide for the necessary low resistivity conductivity for connecting that gate with other areas of the integrated circuit chip being formed.

Source and drain regions 21 and 23 (FIG. 2) are usually formed at this point by ion implantation techniques. In the example being described, an NMOS process, N+ regions are formed as shown.

After the intermediate structure of FIG. 2 is formed, it is desired to cover the entire wafer with an insulating layer, usually silicon dioxide. This is to provide protection to the device as formed in a silicon wafer substrate 11, and also to allow conductors to be formed over this insulating layer without substantially interfering electrically with the devices formed in the substrate below. Accordingly, as shown in FIG. 3, layers 25 and 27 of silicon dioxide are formed. The layer 25 is thin, usually around 1000 angstroms, and is of very high quality. The thicker layer 27 is most conveniently formed by standard chemical vapor deposition (CVD) techniques. But since the quality of the CVD-deposited dioxide is not good enough, the initial layer 25 is formed.

It is the formation of the layer 25 that is the subject of the improved technique of the present invention. For most of the wafer surface, the layer 25 is easily formed on top of previously formed gate oxide layer 15 but the oxide layer 25 also needs to be grown over the metal silicide layer 19' that is part of the gate electrode. The layer 25 is formed in a dry oxygen environment with an appropriate amount of halogenated hydrocarbon gas, preferably 1,1,1-trichloroethane, sufficient to induce growth of oxide over the silicide layer 19'. The amount of trichloroethane introduced preferably constitutes about one percent (1%) to ten percent (10%) of the total gas flowing through the chamber, and more preferably constitutes about six percent (6%) to seven percent (7%) of the total gas flow. Oxidation temperatures should be at least 800 degrees Centigrade, and preferably between about 900 and 950 degrees Centigrade.

Referring to FIG. 4, a well-known high temperature furnace is shown in schematic form. A quartz tube 31 forms a reaction chamber 33 that is closed at one end by a removable cover 35 through which a plurality of wafers 37 may be introduced and removed. An appropriate heating element 39 is provided on the outside of the quartz tube 31, usually an ohmic heating source that induces heating in the wafers 37 when they are emplaced within the tube. An elongated holder 41 adapted to be inserted into tube 31 contains wafers 37.

Gases are introduced into the chamber 33 through inlet port 49 and are removed by means of either outlet port 67 or, if holder 41 has been emplaced in tube 31, through vent 69. A quantity of dry nitrogen is held by container 43 and is connected through flow meter 45 to inlet port 49. A quantity of dry oxygen is similarly held by a container 51 that is connected through flow meter 53 to port 49. A second quantity of dry nitrogen is held by container 47, connected through flow meter 55 and directed into a quantity of liquid 57 enclosed in container 59. A temperature-controlled housing 63 encases container 59, which additionally contains a quantity of halogenated hydrocarbon gas 61. Gas 61, carried by dry nitrogen from source container 47, is directed through check valve 65 into inlet port 49. Gas flow is preferably continuous at about 1 to about 5 liters per minute.

The following examples illustrate certain embodiments of the present invention, and are not intended to limit the scope of the invention as defined in the appended claims.

EXAMPLE 1

A dry oxidation process was carried out at 950 degrees Centigrade using silicon-rich tungsten disilicide ($WSi_x$ where x was approximately 2.3) polycide substrates. The oxidation step was effected by use of dry oxygen and 1,1,1-trichloroethane gas.

The reaction chamber was first purged with nitrogen gas for approximately ten minutes. The end cap was removed, and the polycide substrates were then gradually pushed into the chamber over a period of about five minutes. The substrates were annealed at 950 degrees Centigrade for about ten minutes, ensuring bonding of the tungsten to silicon and equilibrium of temperature. Flow of nitrogen gas through the chamber was held constant at a rate of approximately 2.0 liters per minute for each of these processes.

Oxidation of the substrates was then carried out in a mixture of dry oxygen and 1,1,1-trichloroethane, for variable lengths of time. Flow rate of oxygen was held constant at about 1.5 liters per minute, while the concurrent flow of 1,1,1-trichloroethane was maintained at a rate of about 0.1 liters per minute.

The oxidized substrates were annealed in nitrogen for about fifteen minutes at a temperature of about 950 degrees Centigrade. The substrates were then gradually removed over a period of about five minutes, and the chamber was purged with nitrogen gas for about ten minutes. Flow rate of nitrogen throughout these latter three processes was about 2.0 liters per minute.

The thicknesses of silicon dioxide layers grown over the substrates were measured in several areas over the surfaces of the substrates and averaged. As expected, the average thicknesses of the $SiO_2$ layers obtained varied in approximately a linear fashion with oxidation time. Results are shown in Table 1, below.

EXAMPLE 2

For purposes of comparison with the dry oxidation method of the invention, a steam oxidation process was carried out in a similar manner, using silicon-rich tungsten disilicide substrates identical to those used in Example 1.

Over a period of about fifteen minutes, the reaction chamber was first purged with nitrogen gas, and polycide substrates were gradually pushed into the chamber. The substrates were then annealed at 900 degrees Centigrade for about ten minutes. As in Example 1, flow of nitrogen gas through the chamber was held constant at a rate of approximately 2.0 liters per minute throughout each of these processes.

Oxidation of the substrates was then carried out in steam for variable lengths of time. Gas flow rate during this step was maintained at about 1.5 liters per minute.

The oxidized substrates were annealed in nitrogen for about ten minutes at a temperature of about 900 degrees Centigrade and then gradually removed over a period of about ten minutes. The chamber was then purged with dry nitrogen for about five minutes. Flow rate of nitrogen throughout these last three processes was held constant at about 2.0 liters per minute.

Average silicon dioxide thicknesses were measured as in Example 1. Results are shown in Table 1, below. As may be seen from the table, the inventive method using an $O_2$ trichloroethane mix provided a far more gradual oxidation.

TABLE 1

| Dry Oxidation* | | Steam Oxidation | |
| --- | --- | --- | --- |
| Time, min. | Average $SiO_2$ Thickness, angstroms | Time min. | Average $SiO_2$ Thickness, angstroms |
| 80 | 877 ± 14 | 4 | 634 ± 47 |
| 90 | 900 ± 20 | 8 | 779 ± 56 |
| 160 | 1105 ± 25 | 16 | 1095 ± 66 |

*$O_2$/1,1,1-trichloroethane mix.

EXAMPLE 3

Two tungsten disilicide polycide substrates were oxidized by the dry oxidation method set forth above in Example 1. Oxidation time was approximately 160 minutes. After oxidation and removal of the substrates, measurements of indices of refraction were made at various points on the substrates as a check of $SiO_2$ layer uniformity.

Results are set forth in Table 2.

EXAMPLE 4

For purposes of comparison, indices of refraction were likewise measured on wafers prepared using steam oxidation. Two tungsten disilicide polycide substrates were thus oxidized by the steam oxidation method set forth in Example 2. Oxidation time was approximately 90 minutes, and indices of refraction were measured at various points on the substrates as in Example 3. Results are listed in Table 2.

A comparison of the results yielded by steam oxidation and the dry oxidation process of the invention shows that the inventive method provides a purer and more uniform $SiO_2$ layer, as indicated by the higher indices of refraction obtained.

TABLE 2

| Dry Oxidation* | | Steam Oxidation | |
| --- | --- | --- | --- |
| Wafer # | Index of Refraction | Wafer # | Index of Refraction |
| 1 | 1.45 | 1 | 1.37 |
|  | 1.45 |  | 1.33 |
|  | 1.45 |  | 1.37 |
|  | 1.48 | 2 | 1.37 |
|  | 1.45 |  | 1.33 |
|  | 1.43 |  | 1.37 |
|  |  | 3 | 1.37 |
|  |  |  | 1.33 |
|  |  |  | 1.37 |
|  |  | 4 | 1.37 |

TABLE 2-continued

| Dry Oxidation* | | Steam Oxidation | |
| --- | --- | --- | --- |
| Wafer # | Index of Refraction | Wafer # | Index of Refraction |
| | | | 1.33 |
| | | | 1.37 |

*O$_2$/1,1,1-trichloroethane mix.

I claim:

1. A method of thermally oxidizing a polycide substrate in a dry oxygen environment, comprising the steps of:
   emplacing a polycide substrate in a substantially enclosed chamber, said polycide substrate having a metallic silicide layer and an underlying layer of polycrystalline silicon;
   filling said chamber with oxygen gas;
   heating said substrate to a temperature of at least 800 degrees Centigrade for a predetermined length of time; and
   introducing into said chamber an amount of a halogenated hydrocarbon gas sufficient to induce oxidation of said substrate, whereby a silicon dioxide layer is provided thereon.

2. The method of claim 1, wherein said halogenated hydrocarbon gas comprises a halogenated alkane gas.

3. The method of claim 2, wherein said halogenated alkane gas comprises a chlorinated alkane.

4. The method of claim 3, wherein said chlorinated alkane gas comprises 1,1,1-trichloroethane.

5. The method of claim 1, wherein said chamber includes a gas inlet means and a gas outlet means.

6. The method of claim 5, wherein total gas flow into said inlet means, through said chamber, and out of said outlet means is continuous at approximately 1 to 5 liters per minute.

7. The method of claim 6, wherein said amount of halogenated hydrocarbon gas ranges from about 1% to about 10% by volume of the total gas flowing through said chamber.

8. The method of claim 7, wherein said amount ranges from about 6% to about 7% by volume of the total gas flowing through said chamber.

9. The method of claim 1, wherein said temperature ranges from about 900 degrees Centigrade to about 950 degrees Centigrade.

10. The method of claim 1, wherein said polycide substrates comprises a single crystal semiconductor layer, an electrically insulating SiO$_2$ layer overlying said semiconductor layer, a layer of polycrystalline silicon overlying said SiO$_2$ layer, and a layer of metallic silicide overlying said polycrystalline silicon layer.

11. The method of claim 10, wherein said metallic silicide is of the formula MSi$_x$, where x is greater than 2 and M is a refractory metal.

12. The method of claim 10, wherein said metallic silicide is of the formula MSi$_x$, where x ranges from about 2.2 to about 2.6, and M is a metal selected from the group consisting of tantalum, tungsten, titanium, molybdenum and mixtures thereof.

13. A semiconductor circuit structure, consisting essentially of:
   a single crystal semiconductor layer;
   a first electrically insulating SiO$_2$ layer overlying said semiconductor layer;
   a layer of doped polycrystalline silicon overlying said SiO$_2$ layer;
   a layer of electrically conducting material, said material being a refractory metal silicide, overlying said polycrystalline silicon layer; and
   a second electrically insulating SiO$_2$ layer overlying said silicide layer, provided by the method of claim 1.

14. The structure of claim 13, further comprising a third electrically insulating SiO$_2$ layer overlying said second SiO$_2$ layer.

15. The structure of claim 13, wherein said metal silicide is of the formula MSi$_x$, where x ranges from about 2.2 to about 2.6, and M is a metal selected from the group consisting of tantalum, tungsten, titanium, molybdenum and mixtures thereof.

16. The structure of claim 13, wherein said doped polysilicon layer and said silicide layer have a combined maximum thickness of about 4500 Angstroms.

17. The structure of claim 13, wherein said doped polysilicon layer has a thickness ranging from about 1500 to about 2000 Angstroms and said silicide layer has a thickness ranging from about 2500 to about 3000 Angstroms.

* * * * *